(12) United States Patent
Jeffryes

(10) Patent No.: US 6,468,386 B1
(45) Date of Patent: Oct. 22, 2002

(54) GAS DELIVERY SYSTEM

(75) Inventor: Andrew Isaac Jeffryes, Bristol (GB)

(73) Assignee: Trikon Holdings Ltd., Newport (GB)

( * ) Notice: Subject to any disclaimer, the term of this patent is extended or adjusted under 35 U.S.C. 154(b) by 0 days.

(21) Appl. No.: 09/518,141

(22) Filed: Mar. 3, 2000

(30) Foreign Application Priority Data

Mar. 8, 1999 (GB) .............................. 9051989

(51) Int. Cl.$^7$ ................................ H05H 1/00
(52) U.S. Cl. ................ 156/345.34; 118/723 E
(58) Field of Search ............... 156/345.34; 118/723 R, 118/723 E

(56) References Cited

U.S. PATENT DOCUMENTS

| | | | |
|---|---|---|---|
| 4,158,589 A | * 6/1979 | Keller et al. ............... | 156/345 |
| 4,792,378 A | 12/1988 | Rose et al. | |
| 4,854,263 A | 8/1989 | Chang et al. | |
| 5,074,456 A | * 12/1991 | Degner et al. ............. | 156/345 |
| 5,102,523 A | * 4/1992 | Beisswenger et al. ...... | 156/345 |
| 5,209,803 A | * 5/1993 | Powell ....................... | 156/345 |
| 5,423,936 A | 6/1995 | Tomita et al. | |
| 5,433,786 A | 7/1995 | Hu et al. | |
| 5,610,106 A | 3/1997 | Foster et al. | |
| 5,766,498 A | * 6/1998 | Kojima et al. ............. | 156/345 |

FOREIGN PATENT DOCUMENTS

| | | |
|---|---|---|
| GB | 2 327 382 | 1/1999 |
| JP | 10060673 | 3/1998 |
| WO | WO 93/25724 | 12/1993 |
| WO | WO 98/32892 | 7/1998 |
| WO | WO 99/17335 | 4/1999 |

\* cited by examiner

Primary Examiner—Thi Dang
(74) Attorney, Agent, or Firm—Volentine Francos, PLLC

(57) ABSTRACT

A gas delivery system for plasma treatment apparatus includes a gas inlet, a plenum, a gas delivery plate extending across the downstream end of the plenum and a separate ionizer plate adjacent the downstream face of the gas delivery plate. The ionizer plate is formed with openings which are larger than the apertures in the gas delivery plate.

12 Claims, 2 Drawing Sheets

GAS DELIVERY SYSTEM

Figure 1:
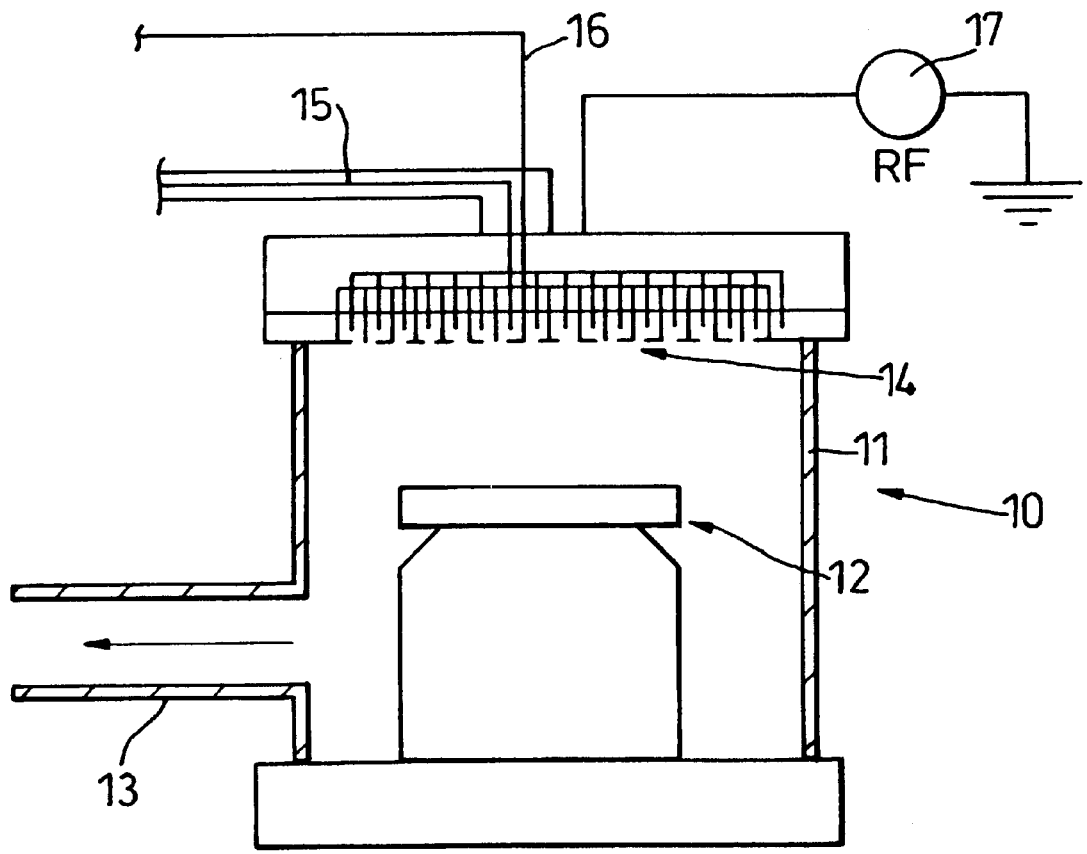

This invention relates to a gas delivery system for use with plasma treatment apparatus.

In many processes, such as plasma etching, chemical vapour deposition and plasma-enhanced vapour deposition, it is desirable to introduce into a reactor chamber one or more gas or vapour in a manner such that the gas or vapour is relatively evenly distributed across the chamber of the plasma apparatus. This is generally achieved by a device known as a showerhead and typically these comprise a casing defining a plenum for receiving gas from an inlet and an outlet plate defining a large number of fine outlets.

Such showerheads frequently also comprise an electrode and generally have to satisfy a number of requirements and, at times, these are conflicting. Thus they must adequately distribute gas flow generally in a uniform or controlled manner over a large area; they must provide a suitable RF electrode; they must ionize gas that passes through the gas outlets to as high a degree as possible; they must not ionize the gas within the plenum; they must avoid shedding particles upon a workpiece; they must be heat emissive in a uniform or controlled manner over a large area; they must be as unreactive as possible with the process chemistries and they must be thermally and mechanically stable. Although the above features have been set out as being essential, in reality Designers have compromised on many of these features.

Examples of such showerheads are described in U.S. Pat. Nos. 4,854,263 and 5,423,936. It will be noted that the outlet plate or manifold acts as the RF electrode in these cases. As the gas pressure is higher on the gas inlet side rather than the downstream side, it is a frequent problem that plasmas ignite inside the showerhead plenum. This can result in detrimental affects on the processing system due to particals being created and falling on the workpiece and the erosion of parts which are not designed to be exposed to a plasma. There can also be significant manufacturing difficulties arising from the need for a very precise array of holes having very precise small diameters. The exposure of the manifold to the plasma in the chamber necessitates the use of particular materials, which often are not those which are most convenient for machining to form the array of holes in the manifold.

From one aspect the present invention consists in a gas delivery system for plasma treatment apparatus comprising a gas inlet, a plenum, a gas delivery plate, having an array of apertures, extending across the downstream end of the plenum characterised in that the system further comprises a separate ionizer plate adjacent the downstream face of the delivery plate, the ionizer plate being formed with openings that are aligned with respective apertures in the gas delivery plate.

It will be appreciated that in this arrangement the gas delivery plate or manifold is not RF driven in sue although it may be capacitively coupled to the RF, if the gas delivery plate and ionizer plate are in close proximity.

The separate construction of the ionizer plate (or RF electrode) and the gas delivery late or manifold immediately introduces a significant number of advantages:

1. The ionizer plate can be manufactured from a material which is well suited to a plasma environment.
2. The openings in the ionizer plate do not define the gas flow and so they can be larger and more readily machined.
3. The gas delivery plate or manifold no longer has to be manufactured from a "plasma resistant" material and a material which is suitable for the requisite machining can be selected.
4. The gas delivery plate or manifold may be earthed if it is D.C. electrically conducting and thus act as a dark space shield or alternatively, as it no longer needs to function as an electrode, it can be made of some other suitable material e.g. a ceramic.
5. The gas delivery plate or manifold and the ionizer plate or electrode may be separately replaceable reducing spare part costs.
6. The gas delivery manifold can be extremely thin, thus increasing the range of manufacturing techniques available for forming the apertures. In this case it will use the structural strength of the ionizer plate and simply rest on the upstream surface of that plate.
7. The downstream face of the ionizer plate can readily be shaped to enhance uniformity or other process characteristics.
8. If a thermal break is provided between the gas delivery plate and the ionizer plate or, if, for example the gas delivery plate is made of ceramic, the ionizer plate can be allowed to become hot, without any concerns about the seals between the gas delivery plate or manifold and the casing defining the plenum. Currently this is a significant problem due to the temperature limits on the elastomeric seals or the material limitations created by clamping arrangements.

It will be understood that the Designer of a gas delivery system in accordance with the invention can utilise one or more of these advantages, depending on the particular apparatus in which the system is to be used.

The openings in the ionizer plate may have a larger cross section than the apertures and that cross section may increase in a downstream direction. As has been mentioned the gas delivery plate may be electrically conducting an earthed or near earthed or alternatively it may be made of electrically non-conducting material.

The system may further comprise a secondary gas delivery plate downstream of the ionizer plate where a process requires a "remote" plasma source.

Any or all of the plates may incorporate heating or cooling devices or additionally, or alternatively, a further plate, incorporating a heating or cooling device, may be provided and may be sandwiched with the existing plates.

The invention also includes plasma apertures incorporating a gas delivery system as defined above and further including an RF power supply connected to the ionizer plate.

Although the invention has been defined above, it includes any inventive combination of the features set out above or in the following description.

Figure 2:
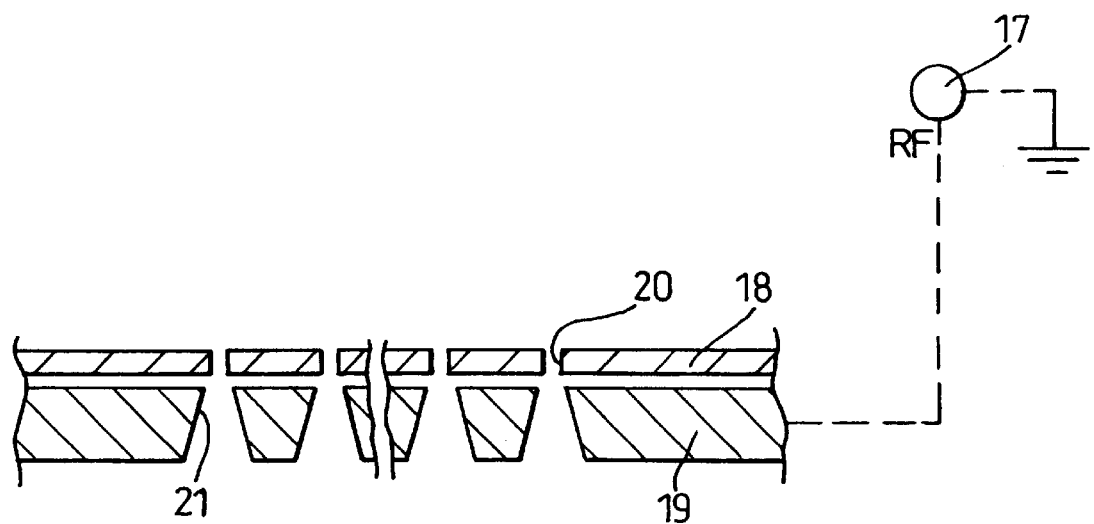
Figure 3:
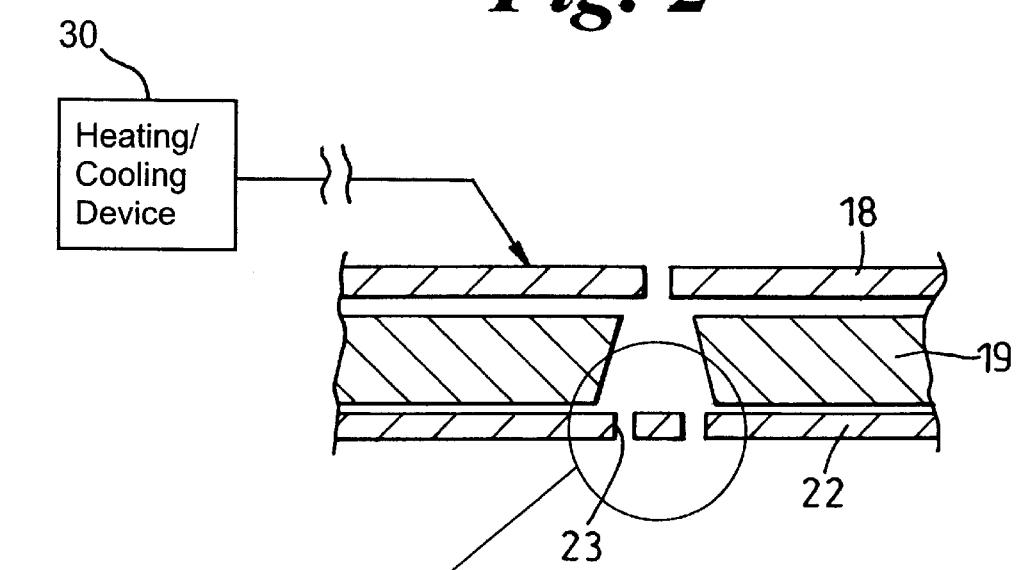
Figure 3:
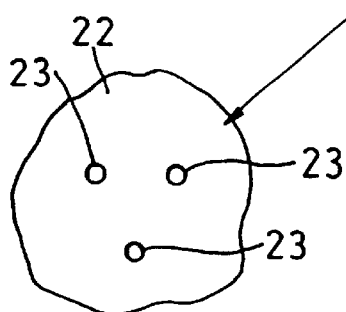

The invention may be performed in various ways and specific embodiments will now be described, by way of example, with reference to the accompanying drawings in which FIG. 1 is a schematic view of a plasma reactor chamber with a showerhead diagrammatically illustrated;

FIG. 2 is a scrap vertical section through the front of a showerhead incorporating an aspect of the invention; and FIG. 3 is a scrap vertical section through a single delivery port of an alternative embodiment of the invention.

In FIG. 1, a plasma reactor apparatus of generally known design is schematically illustrated and generally indicated at 10. The apparatus 10 comprises a chamber 11, a workpiece support 12, a vacuum pump outlet 13, a showerhead 14, first and second gas supplies, 15 and 16 and an RF power source 17, which is connected to the showerhead 14, which acts as an electrode for striking the plasma. Although a two gas supply system is illustrated, it will be appreciated that equally well a single gas supply could be utilised. In normal use a plasma is struck within the chamber 11 and the desired process is carried out on a wafer or other workpiece supported on the support 12.

Turning to FIG. 2, it will be seen that the downstream face of the showerhead 14 is constituted by a two-part construction comprising a gas delivery plate or manifold 18 and, on the downstream side of the gas delivery plate 18, an ionizer plate 19. As can be seen the ionizer plate is connected to the RF power supply 17.

The gas delivery plate 18 is formed with an array of precisely located and defined apertures 20, which themselves define the nature and distribution of the gas flow. The ionizer plate 19 is formed with larger, divergent, aligned openings 21 that allow for a degree of dissociation of the gas and good ionization.

The main advantages of this approach have already been outlined above, but it should be particularly emphasized that the separation of the functionality allows different materials to be chosen such that, for example, the ionizer plate 19 may be made of a material which is resistant to plasma (with our without a thin coating or layer) and which is chap to manufacture or replace. The material could also be resistant to particle shedding. Equally the gas plate may be made of material well suited to the formation of many tiny holes, without significant regard to the presence of plasma, because it is not made remote from the plasma by means of the ionizer plate 19.

The ionizer plate 19 may be heated or allowed to get hot. As it does not need to form a gas seal, as is the case for the electrode manifold of a traditional showerhead, the existing thermal limitations of elastomeric gas seals do not apply. Equally, clamping systems are used to seal the gas delivery plate 18, the physical material characteristics required for such seals do not act as a limitation on the material from which the ionizer plate 19 can be manufactured.

It may be advantageous to operate the ionizer plate 19 ad a radiative heater or to have it present a surface of controlled emissivity. The workpiece processing may be improved by having the ionizer plate 19 at a temperature above that suitable for elastomeric seals. It is anticipated that the different parts of the gas delivery system may very in temperature by at least 100° C.

If the gas delivery plate 18 is conducting, then it may be earthed to act as a dark space shield.

In FIG. 3 an alternative arrangement is shown in which a further gas delivery plate 22 is added on the downstream side of the ionizer plate 19 to produce, effectively, a remote plasma source. As shown in the circle plan view the second gas delivery plate 22 can also present an alternative array of apertures 23. Any or all of the plates 18 and 22 may incorporate heating or cooling devices 30, and/or a further plate 31 for heating and cooling may be sandwiched between the plates as shown.

What is claimed is:

1. A gas delivery system for plasma treatment apparatus comprising a plenum, a gas inlet for introducing a processing gas into the plenum, a gas delivery plate or manifold, having an array of apertures, extending across the downstream end of the plenum, characterized in that the system further comprises a separate ionizer plate adjacent the downstream face of the delivery plate, the ionizer plate being formed with openings that are aligned with respective apertures in the delivery plate.

2. A gas delivery system as claimed in claim 1 characterized in that the openings have a larger cross-section than the apertures.

3. A gas delivery system as claimed in claim 1 wherein the gas delivery plate and the ionizer plate are made of different materials.

4. A gas delivery system for delivery ionized gas comprising a delivery system as claimed in claim 1 and a RF supply connected to the ionizer plate.

5. A gas delivery system for plasma treatment apparatus comprising a gas inlet, a plenum, a gas delivery plate or manifold, having an array of apertures, extending across the downstream end of the plenum, characterized in that the system further comprises a separate ionizer plate adjacent the downstream face of the delivery plate or manifold, the ionizer plate being formed with openings that are aligned with respective apertures in the delivery plate, and further characterized in that the openings increase in cross-section in a downstream direction.

6. A gas delivery system for plasma treatment apparatus comprising a gas inlet, a plenum, a gas delivery plate or manifold, having an array of apertures, extending across the downstream end of the plenum, characterized in that the system further comprises a separate ionizer plate adjacent the downstream face of the delivery plate or manifold, the ionizer plate being formed with openings that are aligned with respective apertures in the delivery plate, and further characterized in that the gas delivery plate is D.C. electrical conducting and is earthed.

7. A gas delivery system for plasma treatment apparatus comprising a gas inlet, a plenum, a gas delivery plate or manifold, having an array of apertures, extending across the downstream end of the plenum, characterized in that the system further comprises a separate ionizer plate adjacent the downstream face of the delivery plate or manifold, the ionizer plate being formed with openings that are aligned with respective apertures in the delivery plate, and further characterized in that the gas delivery plate is D.C. electrically non-conducting.

8. A gas delivery system for plasma treatment apparatus comprising a gas inlet, a plenum, a gas delivery plate or manifold, having an array of apertures, extending across the downstream end of the plenum, characterized in that the system further comprises a separate ionizer plate adjacent the downstream face of the delivery plate or manifold, the ionizer plate being formed with openings that are aligned with respective apertures in the delivery plate, and further characterized in that the gas delivery plate is made of a ceramic material.

9. A gas delivery system for plasma treatment apparatus comprising a gas inlet, a plenum, a gas delivery plate or manifold, having an array of apertures, extending across the downstream end of the plenum, characterized in that the system further comprises a separate ionizer plate adjacent the downstream face of the delivery plate or manifold, the ionizer plate being formed with openings that are aligned with respective apertures in the delivery plate, and further characterized in that the system further comprises a secondary gas delivery plate or manifold downstream of the ionizer plate.

10. A gas delivery system as claimed in claim 9 characterized in that it further comprises a heating or cooling device for one or more of the gas delivery plates or manifolds.

11. A gas delivery system as claimed in claim 10 characterized in that the heating or cooling device comprises a further plate, incorporating a heating or cooling element, which forms a sandwich with the other plates or manifolds.

12. A gas delivery system for plasma treatment apparatus comprising a gas inlet, a plenum, a gas delivery plate or manifold, having an array of apertures, extending across the downstream end of the plenum, characterized in that the system further comprises a separate ionizer plate adjacent the downstream face of the delivery plate or manifold, the ionizer plate being formed with openings that are aligned with respective apertures in the delivery plate, and further characterized in that the upstream side of the ionizer plate extends parallel to the gas delivery plate whilst the downstream side is frustoconical, dished or otherwise shaped to enhance the plasma or process uniformity.

* * * * *